US012637771B2

(12) United States Patent
Jang et al.

(10) Patent No.: US 12,637,771 B2
(45) Date of Patent: May 26, 2026

(54) SUBSTRATE PROCESSING APPARATUS

(71) Applicant: Samsung Display Co., LTD., Yongin-si (KR)

(72) Inventors: Choelmin Jang, Seoul (KR); Junggon Kim, Hwaseong-si (KR); Min-Gyu Park, Cheonan-si (KR); Heeyong Lee, Seongnam-si (KR); Eun Jung, Uiwang-si (KR); Myungsoo Huh, Suwon-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 778 days.

(21) Appl. No.: 17/984,500

(22) Filed: Nov. 10, 2022

(65) Prior Publication Data

US 2023/0144827 A1    May 11, 2023

(30) Foreign Application Priority Data

Nov. 11, 2021    (KR) ........................ 10-2021-0155207

(51) Int. Cl.
| | |
|---|---|
| *C23C 16/455* | (2006.01) |
| *B05B 15/62* | (2018.01) |
| *B05B 15/65* | (2018.01) |
| *B05B 15/70* | (2018.01) |
| *B05C 5/02* | (2006.01) |
| *H10P 72/00* | (2026.01) |
| *H10P 72/76* | (2026.01) |

(52) U.S. Cl.
CPC ........ *C23C 16/45565* (2013.01); *B05B 15/62* (2018.02); *B05B 15/65* (2018.02); *B05B 15/70* (2018.02); *B05C 5/0287* (2013.01); *H10P 72/0462* (2026.01); *H10P 72/7612* (2026.01)

(58) Field of Classification Search
None
See application file for complete search history.

(56) References Cited

U.S. PATENT DOCUMENTS

| | | | |
|---|---|---|---|
| 8,182,608 B2 | 5/2012 | Kerr et al. | |
| 8,333,839 B2 | 12/2012 | Oh | |
| 2011/0305835 A1* | 12/2011 | Bertram, Jr. ...... | C23C 16/45568 118/730 |
| 2012/0141676 A1 | 6/2012 | Sershen et al. | |

(Continued)

FOREIGN PATENT DOCUMENTS

| | | |
|---|---|---|
| KR | 1020160128211 A | 11/2016 |
| KR | 1020180003827 A | 1/2018 |

OTHER PUBLICATIONS

Korean Office Action mailed Jul. 18, 2025 in KR Application No. 10-2021-0155207, 11 pages (w/English-language translation).

*Primary Examiner* — Binu Thomas

(74) *Attorney, Agent, or Firm* — CANTOR COLBURN LLP

(57) ABSTRACT

A substrate processing apparatus may include a chamber having a working space, maintaining a vacuum state, and including an upper wall positioned on the working space, a nozzle assembly positioned in the working space, and including nozzles, and a lifting module including a frame positioned outside of the chamber, a lifting part that lifts the frame, and at least one shaft passing through the upper wall, connected to each of the frame and the nozzle assembly, and extending in a direction of gravity.

20 Claims, 6 Drawing Sheets

(56) References Cited

U.S. PATENT DOCUMENTS

| | | | |
|---|---|---|---|
| 2013/0270362 A1* | 10/2013 | Sferlazzo | C23C 16/45589 |
| | | | 239/225.1 |
| 2015/0184295 A1* | 7/2015 | Jeong | C23C 16/45565 |
| | | | 427/255.28 |
| 2016/0319424 A1 | 11/2016 | Takahashi | |
| 2017/0191160 A1* | 7/2017 | Wiltse | C23C 16/45589 |

* cited by examiner

F I G. 1
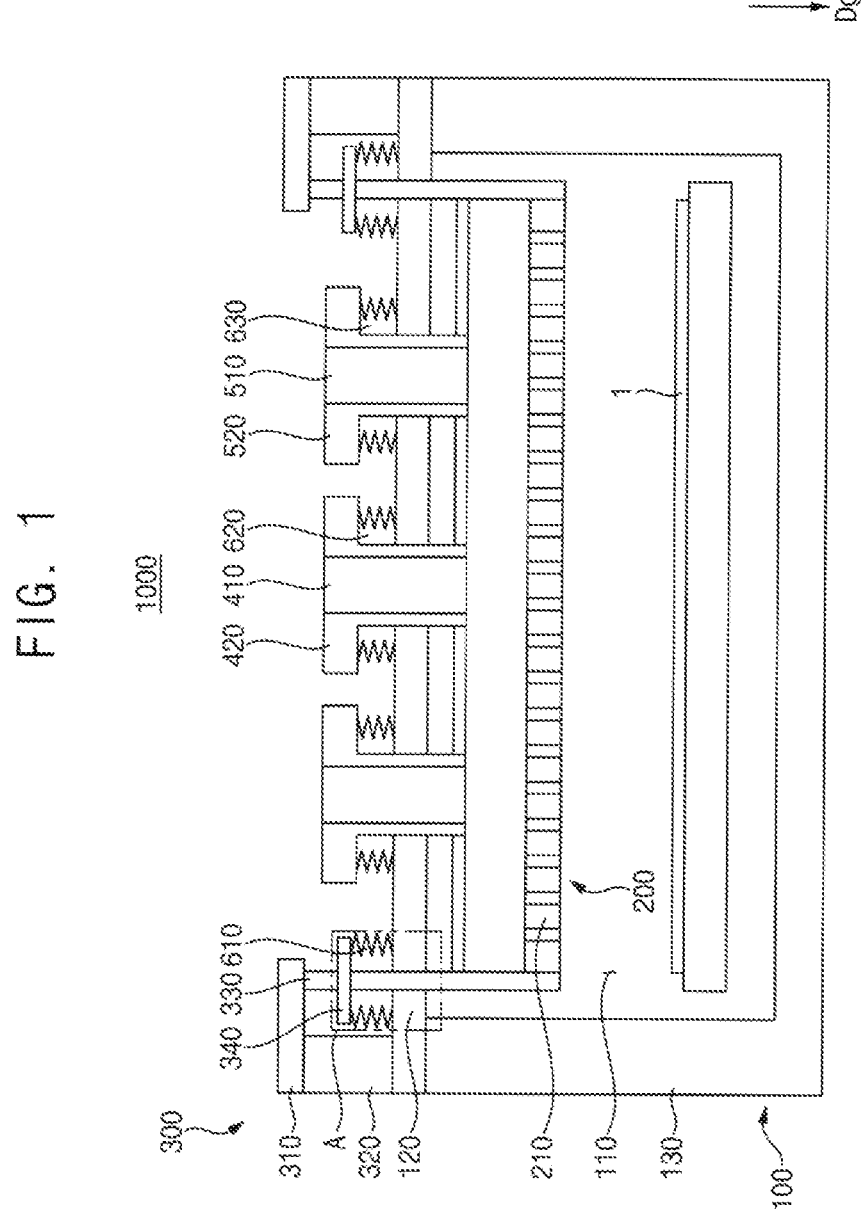

SUBSTRATE PROCESSING APPARATUS

CROSS-REFERENCE TO RELATED APPLICATION(S)

This application claims priority to and benefits of Korean Patent Application No. 10-2021-0155207 under 35 U.S.C. § 119, filed on Nov. 11, 2021, in the Korean Intellectual Property Office (KIPO), the disclosure of which is incorporated by reference herein in its entirety.

BACKGROUND

1. Technical Field

The disclosure relates to a substrate processing apparatus used in a manufacturing process of a display device.

2. Description of the Related Art

Examples of a display device may include a liquid crystal display device and an organic light emitting display device.

In manufacturing a display device, a vacuum chamber for performing manufacturing processes such as etching or deposition in a vacuum state is required. In case that the size of the vacuum chamber increases, pressure applied to the outer wall of the vacuum chamber also increases due to the vacuum pressure formed inside the vacuum chamber, and the vacuum chamber may deform more easily.

SUMMARY

Embodiments of the disclosure provide a substrate processing apparatus with improved process uniformity.

Additional features of the disclosure will be set forth in the description which follows, and in part will be apparent from the description, or may be learned by practice of the disclosure.

A substrate processing apparatus according to an embodiment may include a chamber having a working space, maintaining a vacuum state, and including an upper wall positioned on the working space, a nozzle assembly positioned in the working space and including nozzles, and a lifting module including a frame positioned outside of the chamber, a lifting part that lifts the frame, and at least one shaft passing through the upper wall, connected to the frame and the nozzle assembly, and extending in a direction of gravity.

In an embodiment, a first end portion of the at least one shaft may be connected to the frame on the upper wall, and a second end portion opposite to the first end portion of the at least one shaft may be connected to the nozzle assembly in the working space.

In an embodiment, the lifting module may further include a first fastening part positioned between the upper wall and the frame, surrounding the at least one shaft, fixed to the at least one shaft, and having a flat plate shape, and the substrate processing apparatus may further include at least one first elastic member connected to a bottom surface of the first fastening part and an upper surface of the upper wall, and the at least one first elastic member being expandable and contractible in the direction of gravity.

In an embodiment, the at least one first elastic member may surround the at least one shaft.

In an embodiment, the at least one shaft may be separated from the upper wall.

In an embodiment, the nozzle assembly may have an overall rectangular shape in a plan view, the at least one shaft may include a plurality of shafts, and the plurality of the shafts may be positioned at vertices of the rectangular shape of the nozzle assembly.

In an embodiment, the at least one first elastic member may include a plurality of first elastic members, and the plurality of the first elastic members may be positioned at vertices of the rectangular shape of the nozzle assembly, and surround the plurality of the shafts.

In an embodiment, the substrate processing apparatus may further include a gas supply pipe passing through the upper wall, connected to the nozzle assembly, and supplying gas to the nozzle assembly, a second fastening part positioned on the upper wall, surrounding the gas supply pipe, fixed to the gas supply pipe, and having a flat plate shape and a second elastic member connected to a bottom surface of the second fastening part and an upper surface of the upper wall, and expandable and contractible in the direction of gravity.

In an embodiment, the second elastic member may surround the gas supply pipe.

In an embodiment, the gas supply pipe may be separated from the upper wall.

In an embodiment, the substrate processing apparatus may further include a gas exhaust pipe passing through the upper wall, connected to the nozzle assembly, and exhausting gas from the nozzle assembly to the outside of the chamber, a third fastening part positioned on the upper wall, surrounding the gas exhaust pipe, fixed to the gas exhaust pipe, and having a flat plate shape and a third elastic member connected to a bottom surface of the third fastening part and an upper surface of the upper wall, and expandable and contractible in the direction of gravity.

In an embodiment, the third elastic member may surround the gas exhaust pipe.

In an embodiment, the gas exhaust pipe may be separated from the upper wall.

In an embodiment, the chamber may further include a side wall, and the lifting part may be supported by the side wall.

In an embodiment, the substrate processing apparatus may further include a support frame adjacent to the chamber from the outside of the chamber, wherein the lifting part may be supported by the support frame.

A substrate processing apparatus according to an embodiment may include a chamber having a working space, maintaining a vacuum state, and including an upper wall positioned on the working space, a nozzle assembly positioned in the working space and including nozzles, a lifting module (including a frame positioned outside of the chamber, a lifting part that lifts the frame, a shaft passing through the upper wall, connected to the frame and the nozzle assembly, and extending in a direction of gravity, and a first fastening part positioned between the upper wall and the frame, surrounding the shaft, fixed to the shaft, and having a flat plate shape), a gas supply pipe passing through the upper wall, connected to the nozzle assembly, and supplying gas to the nozzle assembly, a second fastening part positioned on the upper wall, surrounding the gas supply pipe, fixed to the gas supply pipe, and having a flat plate shape, a first elastic member connected to a bottom surface of the first fastening part and an upper surface of the upper wall, and expandable and contractible in the direction of gravity and a second elastic member connected to a bottom surface of the second fastening part and the upper surface of the upper wall, and expandable and contractible in the direction of gravity.

In an embodiment, a first end portion of the shaft may be connected to the frame on the upper wall, and a second end portion opposite to the first end portion of the shaft may be connected to the nozzle assembly in the working space.

In an embodiment, the first elastic member may surround the shaft, and the second elastic member may surround the gas supply pipe.

In an embodiment, each of the shaft and the gas supply pipe may be separated from the upper wall.

In an embodiment, the substrate processing apparatus may further include a gas exhaust pipe passing through the upper wall, connected to the nozzle assembly, and exhausting gas from the nozzle assembly to the outside of the chamber, a third fastening part positioned on the upper wall, surrounding the gas exhaust pipe, fixed to the gas exhaust pipe, and having a flat plate shape and a third elastic member connected to a bottom surface of the third fastening part and the upper surface of the upper wall, and expandable and contractible in the direction of gravity.

According the embodiments of the disclosure, even if the upper wall of the vacuum chamber is deformed by vacuum pressure, the nozzle assembly inside of the vacuum chamber may not be deformed. Accordingly, a distance between the nozzles and the substrate may be kept constant throughout a nozzle assembly, and a uniformity of a substrate processing process may be maintained.

It is to be understood that both the foregoing general description and the following detailed description are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this specification, illustrate embodiments of the disclosure, and together with the description serve to explain the disclosure.

FIG. 1 is a schematic cross-sectional view illustrating a substrate processing apparatus according to an embodiment of the disclosure.

Figure 2:
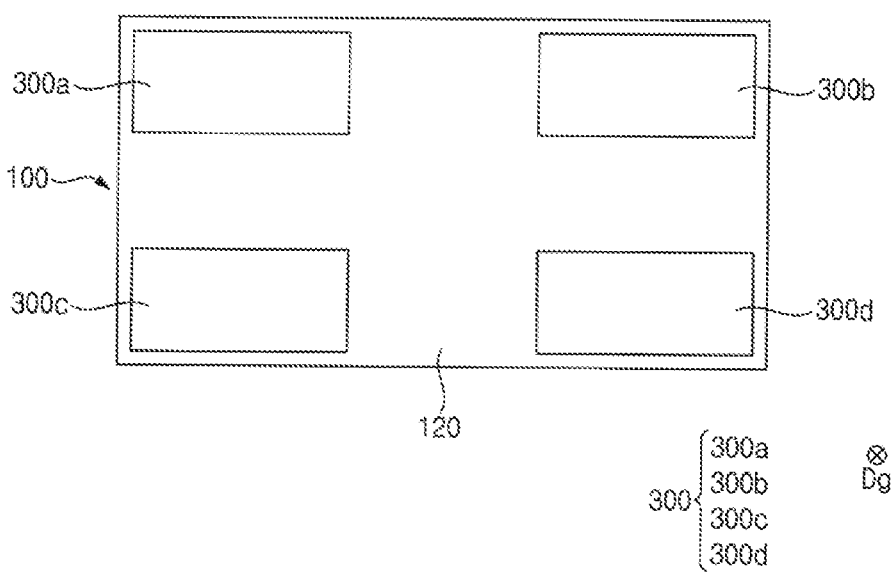
FIG. 2 is a plan view illustrating a lifting module included in the substrate processing apparatus of FIG. 1.

FIS. 6 is a plan view illustrating a second fastening part and a third fastening part included in the substrate processing apparatus of FIG. 1.

Figure 7:
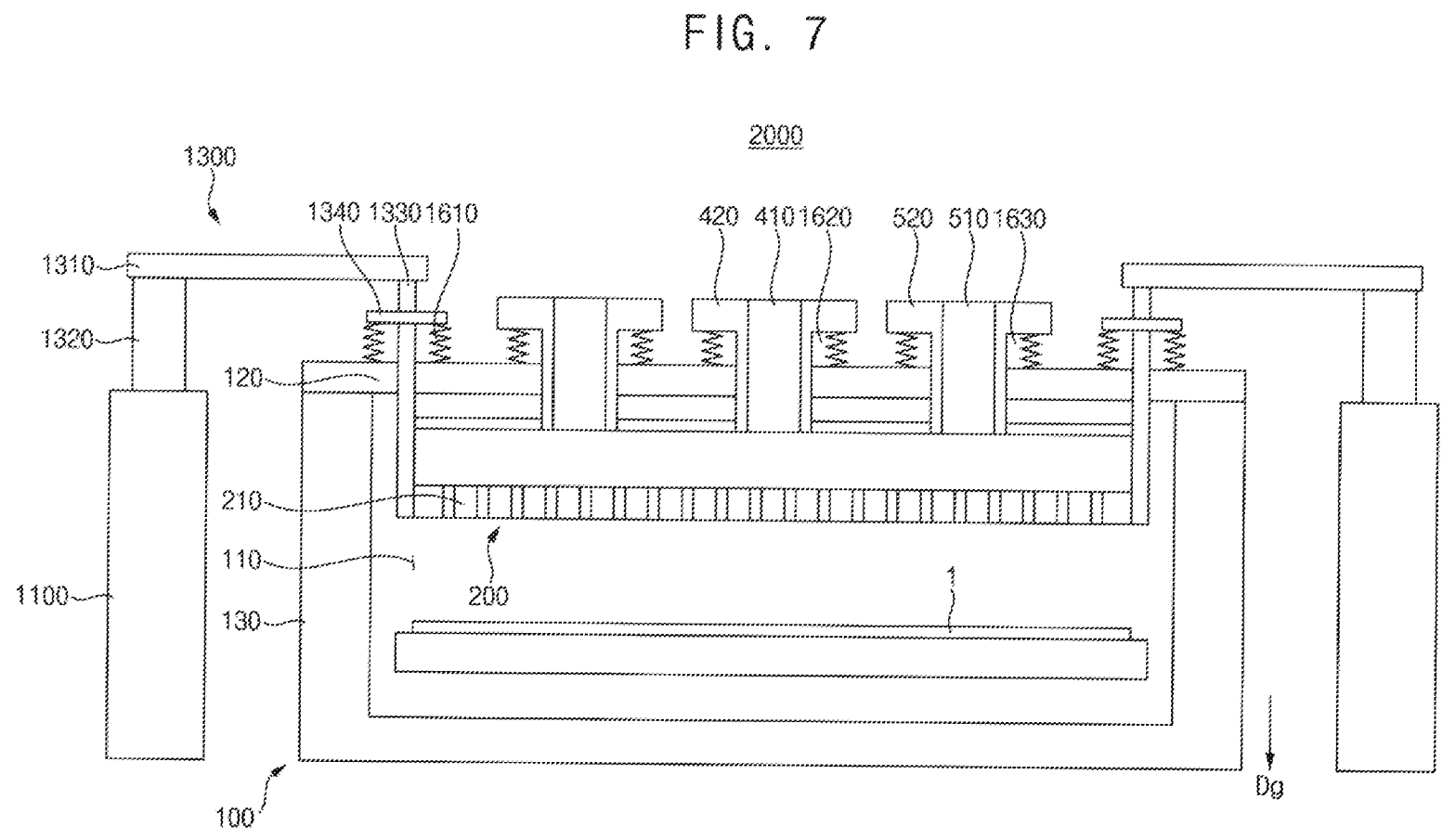

FIG. 7 is a view illustrating a substrate processing apparatus according to an embodiment of the disclosure.

Figure 8:
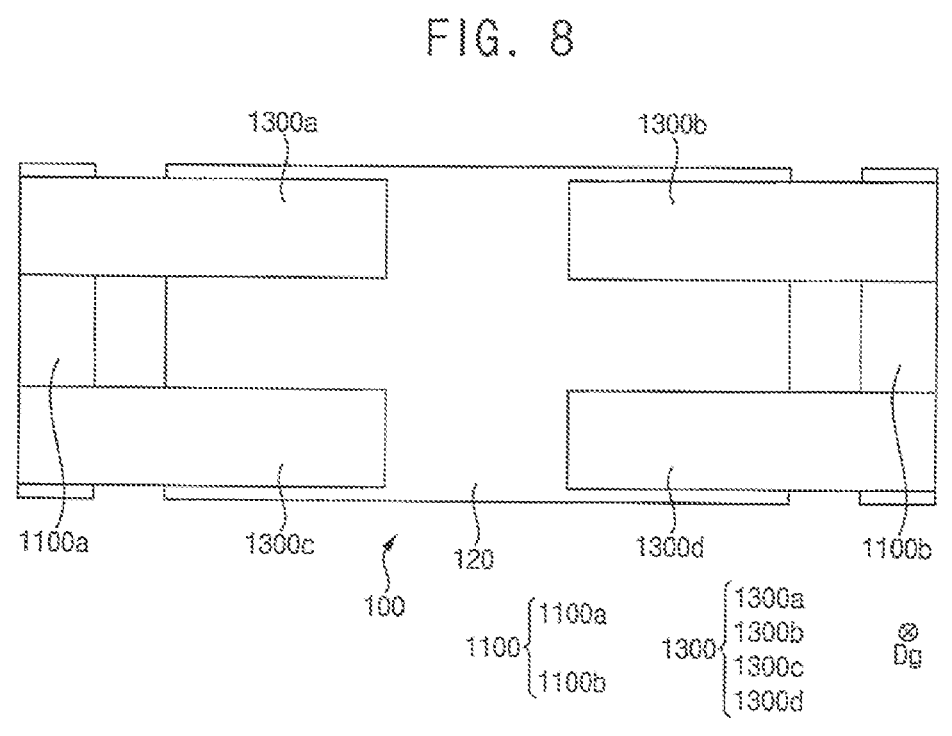

FIG. 8 is a plan view illustrating a lifting module included in the substrate processing apparatus of FIG. 7.

DETAILED DESCRIPTION OF THE EMBODIMENTS

Illustrative, non-limiting embodiments will be more clearly understood from the following detailed description in conjunction with the accompanying drawings.

The spatially relative terms "under", "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

FIG. 1 is a schematic cross-sectional view illustrating a substrate processing apparatus according to an embodiment of the disclosure.

Referring to FIG. 1, a substrate processing apparatus 1000 according to an embodiment of the disclosure may include a chamber 100, a nozzle assembly 200, a lifting module 300 including a first fastening part 340, a gas supply pipe 410, a second fastening part 420, a gas exhaust pipe 510, a third fastening part 520, a first elastic member 610, a second elastic member 620, and a third elastic member 630.

The chamber 100 may have a working space 110 capable of maintaining a vacuum state, and may include an upper wall 120 and a side wall 130. The working space 110 may be a space in which various processing processes for a substrate, such as an etching process or a deposition process, are performed.

The nozzle assembly 200 may be positioned in the working space 110, and may include multiple nozzles 210. The multiple nozzles 210 may spray gas onto the substrate 1.

FIG. 2 is a plan view illustrating a lifting module included in the substrate processing apparatus of FIG. 1.

Referring to FIGS. 1 and 2, the lifting module 300 may include a frame 310, lifting part 320, a shaft 330, and a first fastening part 340, and may lift the nozzle assembly 200.

The frame 310 may be positioned outside of the chamber 100. For example, as illustrated in FIGS. 1 and 2, the frame 310 may be positioned on the upper wall 120 of the chamber 100.

In an embodiment, as illustrated in FIG. 1, the frame 310 may be positioned on the lifting part 320. Also, the frame 310 may overlap each of the lifting part 320, the shaft 330, and the first fastening part 340. Also, the frame 310 may have a rectangular shape in a plan view. Accordingly, as illustrated in FIG. 2, the lifting module 300 may have a rectangular shape in a plan view.

As illustrated in FIG. 1, the lifting part 320 may be connected to the frame 310 and may lift the frame 310. For example, the lifting part 320 may include a jack screw (not illustrated) fixed to the chamber 100 and a motor (not illustrated) for driving the jack screw. Also, the jack screw (not illustrated) may lift the frame 310 by driving of the motor (not illustrated).

In an embodiment, as illustrated in FIG. 1, the sidewall 130 of the chamber 100 may support the lifting part 320.

Figure 3:
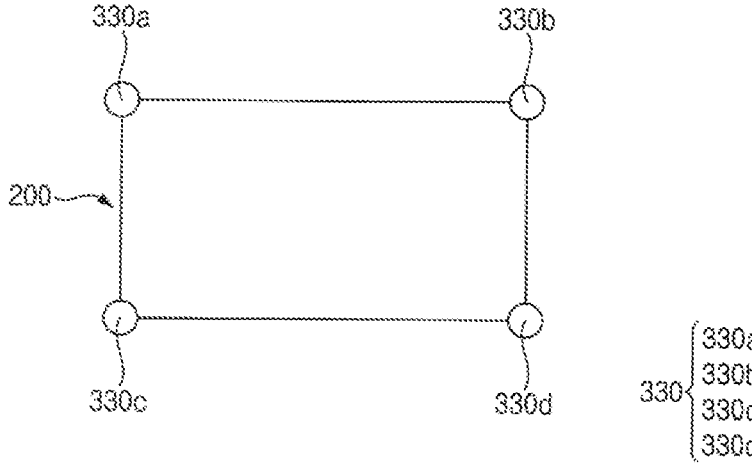
FIG. 3 is a plan view illustrating a shaft included in the lifting module of FIG. 2.

FIG. 3 is a plan view illustrating a shaft included in the lifting module of FIG. 2.

Referring to FIGS. 1 to 3, the shaft 330 may pass through the upper wall 120 of the chamber 100 and may extend in a direction of gravity Dg. Also, the shaft 330 may be connected to each of the frame 310 and the nozzle assembly 200. For example, a first end portion of the shaft 330 may be connected to the frame 310 on the upper wall 120, and a second end portion of the shaft 330 opposite to the first end portion may be connected to the nozzle assembly 200 in the working space 110. Accordingly, the shaft 330 may transmit a power generated outside of the chamber 100 to the nozzle assembly 200.

The lifting part 320 may be connected to the frame 310 and may lift the frame 310. Also, the shaft 330 may transmit the power generated outside of the chamber 100 to the nozzle assembly 200. Accordingly, the lifting module 300 may lift the nozzle assembly 200.

In an embodiment, a first distance of which the frame 310 moves may be substantially the same as a second distance of which the nozzle assembly 200 moves.

In an embodiment, as illustrated in FIG. 3, the nozzle assembly 200 may have an overall rectangular shape in a plan view. Also multiple shaft 330 may be provided, and the multiple of shaft 330a, 330b, 330c, and 330d may be respectively positioned at vertices of the rectangular shape.

Figure 4:
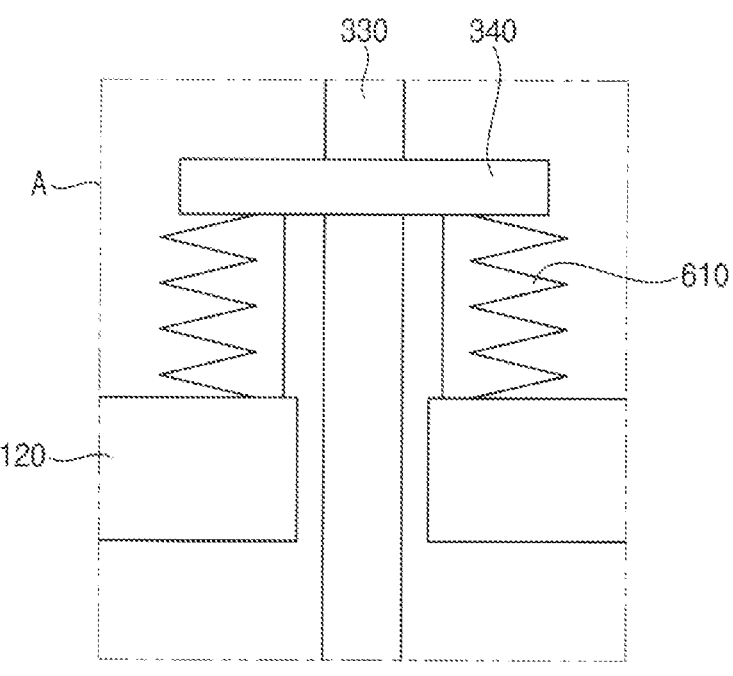
FIG. 4 is an enlarged view illustrating area 'A' of FIG. 1.

FIG. 4 is an enlarged view illustrating area 'A' of FIG. 1.

Referring to FIG. 4, the shaft 330 may be separated from the upper wall 120. For example, the shaft 330 may be not in contact with the upper wall 120. Accordingly, the shaft 330 may be not fixed to the upper wall 120. In other words, The shaft 330 may be not constrained by the upper wall 120, and may descend in the direction of gravity Dg or rise in a direction opposite to the direction of gravity Dg by lifting of the frame 310.

Figure 5:
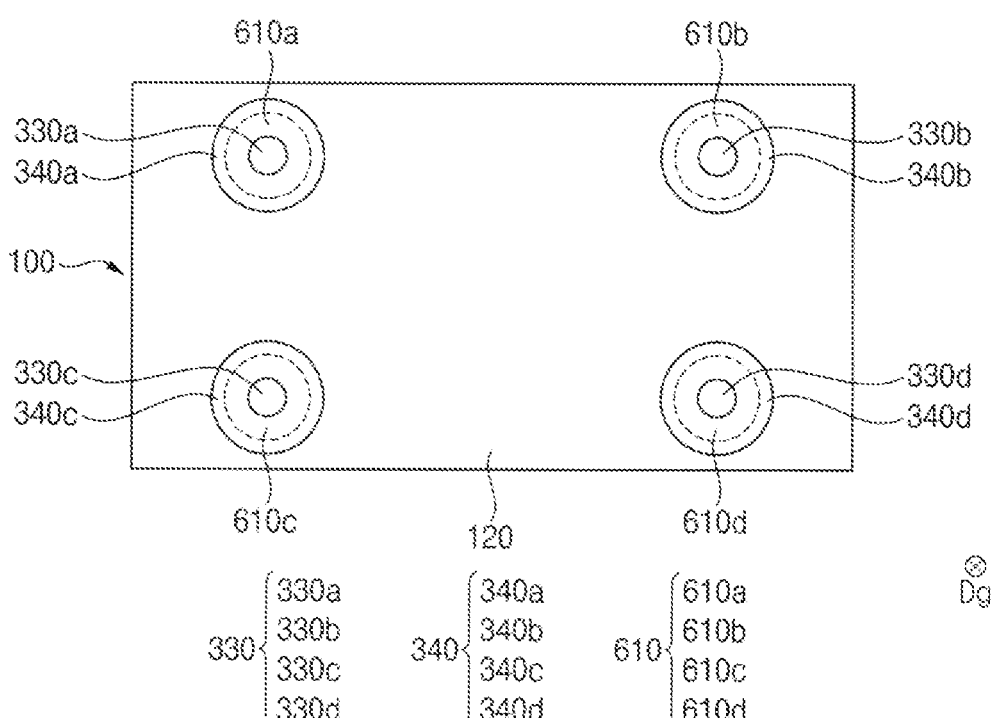
FIG. 5 is a plan view illustrating a first fastening part included in the lifting module of FIG. 2.

FIG. 5 is a plan view illustrating a first fastening part included in the lifting module of FIG. 2.

Referring to FIGS. 4 and 5, the first fastening part 340 may be positioned between the upper wall 120 and the frame 310, may surround the shaft 330, and may be fixed to the shaft 330. Also, the first fastening part 340 may have a flat plate shape. The first fastening part 340 and the shaft 330 may be integral with each other or may be fastened after being formed separately.

In an embodiment, as illustrated in FIG. 5, the first fastening part 340 may have a circular shape in a plan view. However, embodiments are not limited thereto.

As illustrated in FIG. 4, the first elastic member 610 may be connected to a bottom surface of the first fastening part 340 and an upper surface of the upper wall 120, respectively, and may expand and contract in the direction of gravity Dg. Also, the first elastic member 610 may surround the shaft 330.

In an embodiment, as illustrated in FIG. 5, multiple first elastic member 610 may be provided. The multiple first elastic member 610a, 610b, 610c, and 610d may be respectively positioned at the vertices of the rectangular shape described with reference to FIG. 3 and may surround the multiple shaft 330a, 330b, 330c, and 330d, respectively.

In an embodiment, the first elastic member 610 may be a bellows. As illustrated in FIGS. 1 and 5, the first elastic member 610 may seal the chamber 100 so that the working space 110 of the chamber 100 maintains the vacuum state.

In case that the working space 110 maintains a vacuum state, the chamber 100 may be deformed by vacuum pressure. For example, in case that the working space 110 maintains a vacuum state, the upper wall 120 may sag in the direction of gravity Dg. If the nozzle assembly 200 is fixed to the upper wall 120 or a movement is restricted, the nozzle assembly 200 may deflect in the direction of gravity Dg. Also, the amount of deflection of a center of the nozzle assembly 200 may be different from the amount of deflection of a edge of the nozzle assembly 200. Accordingly, in case that the multiple nozzles 210 inject gas onto the substrate 1, a characteristic of the center of the substrate 1 and a characteristic of the edge of the substrate 1 may be different.

However, according to embodiments of the disclosure, the lifting module 300 for lifting the nozzle assembly 200 may be supported by the sidewall 130 of the chamber 100. Also, the shaft 330 connected to the nozzle assembly 200 may be separated from the upper wall 120 and may not be constrained by the upper wall 120. Also, the first elastic member 610 connecting the first fastening part 340 fixed to the shaft 330 and the upper wall 120 may be expandable and contractible in the direction of gravity Dg. Accordingly, even if the upper wall 120 is deformed by the vacuum pressure, the nozzle assembly 200 may not be deformed. Accordingly, a distance between the nozzles 210 and the substrate 1 may be kept constant throughout the nozzle assembly 200, and a uniformity of a substrate processing process may be maintained.

FIS. 6 is a plan view illustrating a second fastening part and a third fastening part included in the substrate processing apparatus of FIG. 1.

Figure 6:
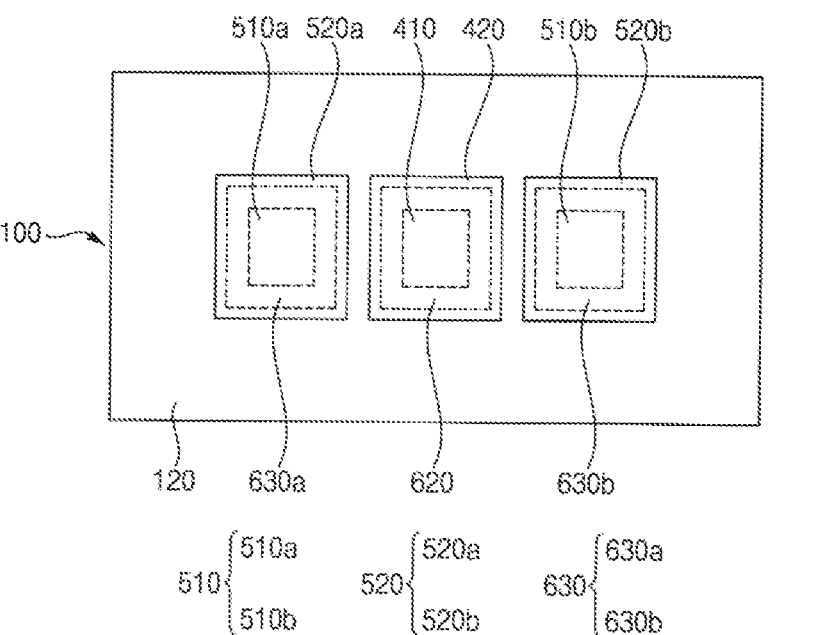

Referring to FIGS. 1 and 6, the gas supply pipe 410 may pass through the upper wall 120 and may be connected to the nozzle assembly 200. The gas supply pipe 410 may supply gas to the nozzle assembly 200.

The second fastening part 420 may be positioned on the upper wall 120 and may surround the gas supply pipe 410. The second fastening part 420 may have a flat plate shape.

In an embodiment, as illustrated in FIG. 6, the second fastening part 420 may have a rectangular shape in a plan view. However, embodiments are not limited thereto.

The second elastic member 620 may be connected to a bottom surface of the second fastening part 420 and the upper surface of the upper wall 120, respectively, and may expand and contract in the direction of gravity Dg. Also, the second elastic member 620 may surround the gas supply pipe 410.

In an embodiment, the second elastic member 620 may be a bellows. As illustrated in FIGS. 1 and 6, the second elastic member 620 may seal the chamber 100 so that the working space 110 of the chamber 100 maintains the vacuum state.

The gas supply pipe 410 may be separated from the upper wall 120. For example, the gas supply pipe 410 may be not in contact with the upper wall 120 like the shaft 330 described with reference to FIG. 4. Accordingly, the gas supply pipe 410 may not be fixed to the upper wall 120. In other words, the gas supply pipe 410 may be not constrained by the upper wall 120, and may rise in the direction of gravity Dg or may descend in a direction opposite to the direction of gravity Dg. Accordingly, even if the upper wall 120 is deformed by the vacuum pressure, the nozzle assembly 200 may not be deformed. Accordingly, the distance between the nozzles 210 and the substrate 1 may be kept constant throughout the nozzle assembly 200, and the uniformity of the substrate processing process may be maintained.

The gas exhaust pipe 510 may pass through the upper wall 120 and may be connected to the nozzle assembly 200. The gas exhaust pipe 510 may exhaust gas from the nozzle assembly 200 to the outside of the chamber 100.

In an embodiment, as illustrated in FIG. 6, multiple gas exhaust pipes 510 may be provided. The multiple gas exhaust pipes 510a and 510b may be symmetrical with respect to the gas supply pipe 410. However, embodiments are not limited thereto.

The third fastening part 520 may be positioned on the upper wall 120 and may surround the gas exhaust pipe 510. The third fastening part 520 may have a flat plate shape.

In an embodiment, as illustrated in FIG. 6, multiple third fastening parts 520 may be provided. The multiple third fastening parts 520*a* and 520*b* may surround the multiple gas exhaust pipes 510*a* and 510*b*, respectively.

In an embodiment, as illustrated in FIG. 6, the third fastening part 520 may have a rectangular shape in a plan view. However, embodiments are not limited thereto.

The third elastic member 630 may be connected to a bottom surface of the third fastening part 520 and the upper surface of the upper wall 120, respectively, and may expand and contract in the direction of gravity Dg. Also, the third elastic member 630 may surround the gas exhaust pipe 510.

In an embodiment, the third elastic member 630 may be a bellows. As illustrated in FIGS. 1 and 6, the third elastic member 630 may seal the chamber 100 so that the working space 110 of the chamber 100 maintains the vacuum state.

The gas exhaust pipe 510 may be separated from the upper wall 120. For example, the gas exhaust pipe 510 may be not in contact with the upper wall 120 like the shaft 330 described with reference to FIG. 4. Accordingly, the gas exhaust pipe 510 may be not fixed to the upper wall 120. In other words, the gas exhaust pipe 510 may not be constrained by the upper wall 120, and may rise in the direction of gravity Dg or may descend in the direction opposite to the direction of gravity Dg. Accordingly, even if the upper wall 120 is deformed by the vacuum pressure, the nozzle assembly 200 may not be deformed. Accordingly, the distance between the nozzles 210 and the substrate 1 may be kept constant throughout the nozzle assembly 200, and the uniformity of the substrate processing process may be maintained.

FIG. 7 is a view illustrating a substrate processing apparatus according to an embodiment of the disclosure.

Referring to FIG. 7, the substrate processing apparatus 2000 according to an embodiment of the disclosure may include a chamber 100, a nozzle assembly 200, a support frame 1100, a lifting module 1300 including a first fastening part 1340, a gas supply pipe 410, a second fastening part 420, a gas exhaust pipe 510, a third fastening part 520, a first elastic member 1610, a second elastic member 1620, a the third elastic member 1630.

The support frame 1100 included in the substrate processing apparatus 2000 may be positioned adjacent to the chamber 100 outside of the chamber 100.

Hereinafter, a description of the substrate processing apparatus 1000 already described with reference to FIG. 1 will be omitted or simplified.

FIG. 8 is a plan view illustrating a lifting module included in the substrate processing apparatus of FIG. 7.

Referring to FIGS. 7 and 8, the lifting module 1300 may include a frame 1310, lifting part 1320, a shaft 1330, and a first fastening part 1340, and may lift the nozzle assembly 200.

The frame 1310 may be positioned outside of the chamber 100. For example, as illustrated in FIGS. 7 and 8, the frame 1310 may be positioned on the support frame 1100.

In an embodiment, as illustrated in FIG. 7, The frame 1310 may be positioned on the lifting part 1320, and may overlap each of the lifting part 1320, the shaft 1330, and the first fastening part 1340. Also, the frame 1310 may have a rectangular shape in a plan view. Accordingly, as illustrated in FIG. 8, the lifting module 1300 may have the rectangular shape in a plan view.

As illustrated in FIG. 7, the lifting part 1320 may be connected to the frame 1310 and may lift the frame 1310. For example, the lifting part 1320 may include a jack screw (not illustrated) fixed to the support frame 1100 and a motor (not illustrated) for driving the jack screw. Also, the jack screw (not illustrated) may lift the frame 1310 by driving of the motor (not illustrated).

In an embodiment, as illustrated in FIG. 7, the support frame 1100 may support the lifting part 1320.

The shaft 1330 may pass through the upper wall 120 of the chamber 100 and may extend in the direction of gravity Dg. Also, the shaft 1330 may be connected to each of the frame 1310 and the nozzle assembly 200. For example, a first end portion of the shaft 1330 may be connected to the frame 1310 on the upper wall 120, and a second end portion opposite to the first end portion of the shaft 1330 may be connected to the nozzle assembly 200 in the working space 110 . Accordingly, the shaft 1330 may transmit a power generated outside of the chamber 100 to the nozzle assembly 200.

The lifting part 1320 may be connected to the frame 1310 and may lift the frame 1310. Also, the shaft 1330 may transmit the power generated outside of the chamber 100 to the nozzle assembly 200. Accordingly, the lifting module 1300 may lift the nozzle assembly 200.

The shaft 1330 may be separated from upper wall 120. For example, shaft 330 may be not in contact with the upper wall 120. Accordingly, the shaft 1330 may be not fixed to the upper wall 120. In other words, the shaft 1330 may not be constrained by the upper wall 120, and may rise in the direction of gravity Dg or may descend in the direction opposite to the direction of gravity Dg.

According to embodiments of the disclosure, the lifting module 1300 for lifting the nozzle assembly 200 may be supported by the support frame 1100 positioned outside of the chamber 100. Also, the shaft 1330 connected to the nozzle assembly 200 may be separated from the upper wall 120 of the chamber 100 and may be not constrained by the upper wall 120. Also, the first elastic member 1610 connecting the first fastening part 1340 fixed to the shaft 1330 and the upper wall 120 may be expandable and contractible in the direction of gravity Dg. Accordingly, even if the upper wall 120 or the side wall 130 of the chamber 100 is deformed by the vacuum pressure, the nozzle assembly 200 may not be deformed. Accordingly, the distance between the nozzles 210 and the substrate 1 may be kept constant throughout the nozzle assembly 200, and the uniformity of the substrate processing process may be maintained.

Although certain embodiments and implementations have been described herein, other embodiments and modifications will be apparent from this description. Accordingly, the disclosure are not limited to such embodiments, but rather to the broader scope of the appended claims and various obvious modifications and equivalent arrangements as would be apparent to a person of ordinary skill in the art.

What is claimed is:

1. A substrate processing apparatus comprising:
a chamber having a working space, maintaining a vacuum state, and including an upper wall positioned on the working space;
a nozzle assembly positioned in the working space and including nozzles arrayed in a plane of the nozzle assembly; and
a lifting module comprising:
a frame positioned outside of the chamber;
a lifting part that lifts the frame; and
at least one shaft passing through the upper wall, connected to the frame and connected to the nozzle assembly outside of the nozzles in the plane of the nozzle assembly, and extending in a direction of gravity.

2. The substrate processing apparatus of claim 1, wherein a first end portion of the at least one shaft is connected to the frame on the upper wall, and a second end portion opposite to the first end portion of the at least one shaft is connected to the nozzle assembly in the working space.

3. The substrate processing apparatus of claim 1, wherein the lifting module further comprises a first fastening part positioned between the upper wall and the frame, surrounding the at least one shaft, fixed to the at least one shaft, and having a flat plate shape, and the substrate processing apparatus further comprises at least one first elastic member connected to a bottom surface of the first fastening part and an upper surface of the upper wall, the at least one first elastic member being expandable and contractible in the direction of gravity.

4. The substrate processing apparatus of claim 3, wherein the at least one first elastic member surrounds the at least one shaft.

5. The substrate processing apparatus of claim 3, wherein the at least one shaft is separated from the upper wall.

6. A substrate processing apparatus comprising:

a chamber having a working space, maintaining a vacuum state, and including an upper wall positioned on the working space;

a nozzle assembly positioned in the working space and including nozzles; and a lifting module comprising:

a frame positioned outside of the chamber;

a lifting part that lifts the frame; and at least one shaft passing through the upper wall, connected to the frame and the nozzle assembly, and extending in a direction of gravity, wherein:

the lifting module further comprises a first fastening part positioned between the upper wall and the frame, surrounding the at least one shaft, fixed to the at least one shaft, and having a flat plate shape, and the substrate processing apparatus further comprises at least one first elastic member connected to a bottom surface of the first fastening part and an upper surface of the upper wall, the at least one first elastic member being expandable and contractible in the direction of gravity, and wherein:

the nozzle assembly has an overall rectangular shape in a plan view, the at least one shaft includes a plurality of shafts, and the plurality of the shafts are positioned at vertices of the rectangular shape of the nozzle assembly.

7. The substrate processing apparatus of claim 6, wherein the at least one first elastic member includes a plurality of first elastic members, and the plurality of the first elastic members are positioned at vertices of the rectangular shape of the nozzle assembly, and surround the plurality of the shafts.

8. The substrate processing apparatus of claim 1, further comprising:

a gas supply pipe passing through the upper wall, connected to the nozzle assembly, and supplying gas to the nozzle assembly;

a second fastening part positioned on the upper wall, surrounding the gas supply pipe, fixed to the gas supply pipe, and having a flat plate shape; and a second elastic member connected to a bottom surface of the second fastening part and an upper surface of the upper wall, and expandable and contractible in the direction of gravity.

9. The substrate processing apparatus of claim 8, wherein the second elastic member surrounds the gas supply pipe.

10. The substrate processing apparatus of claim 8, wherein the gas supply pipe is separated from the upper wall.

11. The substrate processing apparatus of claim 1, further comprising:

a gas exhaust pipe passing through the upper wall, connected to the nozzle assembly, and exhausting gas from the nozzle assembly to the outside of the chamber;

a third fastening part positioned on the upper wall, surrounding the gas exhaust pipe, fixed to the gas exhaust pipe, and having a flat plate shape; and a third elastic member connected to a bottom surface of the third fastening part and an upper surface of the upper wall, and expandable and contractible in the direction of gravity.

12. The substrate processing apparatus of claim 11, wherein the third elastic member surrounds the gas exhaust pipe.

13. The substrate processing apparatus of claim 11, wherein the gas exhaust pipe is separated from the upper wall.

14. The substrate processing apparatus of claim 1, wherein the chamber further includes a side wall, and the lifting part is supported by the side wall.

15. The substrate processing apparatus of claim 1, further comprising:

a support frame adjacent to the chamber from the outside of the chamber, wherein the lifting part is supported by the support frame.

16. A substrate processing apparatus comprising:

a chamber having a working space, maintaining a vacuum state, and including an upper wall positioned on the working space;

a nozzle assembly positioned in the working space and including nozzles;

a lifting module comprising:

a frame positioned outside of the chamber;

a lifting part that lifts the frame;

a shaft passing through the upper wall, connected to the frame and the nozzle assembly, and extending in a direction of gravity; and a first fastening part positioned between the upper wall and the frame, surrounding the shaft, fixed to the shaft, and having a flat plate shape;

a gas supply pipe passing through the upper wall, connected to the nozzle assembly, and supplying gas to the nozzle assembly;

a second fastening part positioned on the upper wall, surrounding the gas supply pipe, fixed to the gas supply pipe, and having a flat plate shape;

a first elastic member connected to a bottom surface of the first fastening part and an upper surface of the upper wall, and expandable and contractible in the direction of gravity; and a second elastic member connected to a bottom surface of the second fastening part and the upper surface of the upper wall, and expandable and contractible in the direction of gravity.

17. The substrate processing apparatus of claim 16, wherein a first end portion of the shaft is connected to the frame on the upper wall, and a second end portion opposite to the first end portion of the shaft is connected to the nozzle assembly in the working space.

18. The substrate processing apparatus of claim 16, wherein the first elastic member surrounds the shaft, and the second elastic member surrounds the gas supply pipe.

19. The substrate processing apparatus of claim 16, wherein each of the shaft and the gas supply pipe is separated from the upper wall.

20. The substrate processing apparatus of claim 16, further comprising:

a gas exhaust pipe passing through the upper wall, connected to the nozzle assembly, and exhausting gas from the nozzle assembly to the outside of the chamber;

a third fastening part positioned on the upper wall, surrounding the gas exhaust pipe, fixed to the gas exhaust pipe, and having a flat plate shape; and a third elastic member connected to a bottom surface of the third fastening part and the upper surface of the upper wall, and expandable and contractible in the direction of gravity.

\* \* \* \* \*